United States Patent
Wu et al.

(10) Patent No.: US 7,267,842 B2
(45) Date of Patent: Sep. 11, 2007

(54) METHOD FOR REMOVING TITANIUM DIOXIDE DEPOSITS FROM A REACTOR

(75) Inventors: Dingjun Wu, Macungie, PA (US); Bing Ji, Allentown, PA (US); Philip Bruce Henderson, Allentown, PA (US); Eugene Joseph Karwacki, Jr., Orefield, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 499 days.

(21) Appl. No.: 10/800,880

(22) Filed: Mar. 15, 2004

(65) Prior Publication Data

US 2005/0202167 A1 Sep. 15, 2005

(51) Int. Cl.
*C23C 16/00* (2006.01)
*H05H 1/24* (2006.01)

(52) U.S. Cl. .............. 427/248.1; 427/255.23; 427/569; 134/1.1; 134/22.1

(58) Field of Classification Search ............. 427/248.1, 427/255.23, 569
See application file for complete search history.

(56) References Cited

U.S. PATENT DOCUMENTS

| | | | |
|---|---|---|---|
| 4,529,474 A | 7/1985 | Fujiyama et al. | |
| 4,576,698 A | 3/1986 | Gallagher et al. | |
| 4,657,616 A | 4/1987 | Benzing et al. | |
| 4,786,352 A | 11/1988 | Benzing | |
| 5,425,842 A | 6/1995 | Zijlstra | |
| 5,486,235 A | 1/1996 | Ye et al. | |
| 5,788,778 A * | 8/1998 | Shang et al. | 134/1 |
| 6,027,766 A | 2/2000 | Greenberg et al. | |
| 6,379,575 B1 | 4/2002 | Yin et al. | |
| 6,544,345 B1 | 4/2003 | Mayer et al. | |
| 6,554,910 B1 * | 4/2003 | Sandhu et al. | 134/26 |
| 6,635,569 B1 * | 10/2003 | Ameen et al. | 438/680 |
| 6,679,978 B2 | 1/2004 | Johnson et al. | |
| 2002/0071912 A1 * | 6/2002 | Giolando | 427/255.19 |
| 2003/0235695 A1 | 12/2003 | Greenberg, et al. | |

FOREIGN PATENT DOCUMENTS

JP 61-106780 5/1986

OTHER PUBLICATIONS

"Structured Coatings and Nano-Engineered Materials," *CERAC Inc.*, vol. 12, #4 (2002).
G. Dang, et al., Comparison of Dry and Wet Etch Processes for Patterning $SiO_2/TiO_2$ Distributed Bragg Reflectors for Vertical-Cavity Surface-Emitting Lasers, *Journal of the Electrochemical Society*, 148 (2), p. G25-G28 (2001).
Y. Kuo, "Plasma Etching Mechanism of Metal Oxides Derived from RIE of $Ta_2O_5$ and $TiO_2$," *Electrochemical Society Proceedings*, vol. 96, 12, p. 536-544.
S. Norasetthekul, et al., Dry Etch Chemistries for $TiO_2$ thin films, *Applied Surface Science*, 185, p. 27-33 (2001).
T. Shiano, et al., "Etching of $(Ba,Sr)TiO_3$ Film by Chlorine Plasma," *J. Vac. Sci. Techno.*, A 18(5), p. 2080-2084 (2000).

* cited by examiner

Primary Examiner—Timothy Meeks
Assistant Examiner—Kelly M Stouffer
(74) Attorney, Agent, or Firm—Rosaleen P. Morris-Oskanian; Joseph D. Rossi

(57) ABSTRACT

A process for the selective removal of a $TiO_2$-containing substance from an article for cleaning applications is disclosed herein. In one embodiment, there is provided a process for removing a $TiO_2$-containing substance from an article comprising: providing the article having the $TiO_2$-containing substance deposited thereupon; reacting the substance with a reactive gas comprising at least one selected from a fluorine-containing cleaning agent, a chlorine-containing cleaning agent and mixtures thereof to form a volatile product; and removing the volatile product from the article to thereby remove the substance from the article.

20 Claims, No Drawings

METHOD FOR REMOVING TITANIUM DIOXIDE DEPOSITS FROM A REACTOR

BACKGROUND OF THE INVENTION

Titanium dioxide ($TiO_2$) is oftentimes used as a coating for a variety of articles, for example, glass-containing work pieces such as, but not limited to, glass sheets or a continuous glass float ribbon; metal or metal-containing work pieces such as lens or mirrors; ceramic work pieces; and other materials, due to its high refractive index, high dielectric constant, and optical transmittance particularly in the visible and near-AIR region. These coated articles are used in a variety of industries such as, but not limited to, construction, optics, aerospace, magnetic memory manufacturing, and automobile.

One particular application for titanium dioxide ($TiO_2$) coatings is to provide a photocatalytically-activated self-cleaning (PASC) surface on an article such as glass windows used in the construction industry. These coatings, when applied to the surface of the glass window that is exposed to environmental conditions, render the surface superhydrophilic after activation, i.e., exposure to UV radiation. An activated PASC coated surface can have a water contact angle as low as 10 degrees compared to water contact angles of up to 40 degrees on untreated surfaces. At such low contact angles, water readily spreads out into a film, and promotes the removal of environmental residues, such as dust and dirt, from the window surface. Because of this, PASC coated glass is also referred to as self-cleaning glass since water alone is capable of lifting and removing foreign materials from its surface.

The $TiO_2$ coating can be deposited onto an article using a variety of deposition methods, including chemical vapor deposition (CVD) such as atmospheric pressure chemical vapor deposition (APCVD), spray pyrolysis, and vacuum deposition methods such as magnetron sputtered vacuum deposition (MSVD). In a typical CVD process, gaseous or vapor phase metal precursors are carried to the heated surface of the article by a flow of gas. The reagents react on the surface to form a thin coating. In vacuum deposition, one or more articles to be coated are passed into an evacuated chamber. A plasma (glow discharge) is formed from a plasma-producing gas such as argon, helium, etc., introduced into the evacuated system. The ions in the plasma are accelerated at a cathode "target" made from the substance that is to be deposited onto the article surface. The impact of the plasma ion dislodges material from the target. The dislodged material deposits on the surface, forming a thin coating. In reactive sputtering, a reactive gas chemically combines with the dislodged material from the target to form a new chemical species that deposits on the surface. For example, a $TiO_2$ coating is deposited onto the article surface using a titanium-containing target in a reactive oxygen atmosphere.

These processes not only deposit $TiO_2$ on the surface of the article but also deposit $TiO_2$ unproductively upon the inner walls and other surfaces within the reactor chamber in which the processes are being performed. After a certain number of process cycles, the $TiO_2$ coating on the inner surfaces within the reactor can grow to such a thickness that may result in flaking of the residues from the walls. These residues can find their way onto the article being coated and form defects in the coating. In certain applications such as when the article to be coated is a glass work piece, defects can occur such as blemishes within the glass, poor adhesion of the $TiO_2$ coating to the article surface, and other abnormalities. Such defects can result in an unacceptable product and/or loss of yield. Further, in certain deposition methods, such as sputtering, the surface residues can interfere with the sputtering process thereby decreasing product yield.

Deposition reactors are cleaned periodically to mitigate the occurrence of defects. Current industry practice is to clean the reactor by taking the reactor offline and mechanically removing (scraping, abrading, brushing and/or shot blasting) the wall coating. Yet other methods involve taking the reactor off-line and using wet chemicals alone or with the aforementioned mechanical methods to remove the deposition residues from the internal surfaces of the reactors and any fixtures contained therein. Still another method in cleaning the reactor involves coating the entire chamber with a sacrificial film such as aluminum foil and then disposing of the foil after one or more production cycles. All of these methods typically result in costly reactor down time before and/or after the cleaning operation is conducted.

Other cleaning methods may be conducted during the production cycle. In CVD reactors, for example, the reactor walls are typically sprayed with nitrogen and scraped with special tools that withstand the high reactor temperature. Since the production line cannot be stopped during the cleaning operation, the scraped debris falls onto the surface of the article and produces unwanted defects on the surface. This unacceptable product must be re-melted or thrown away. After a moderate number of cycles, manual cleaning is no longer effective and the reactor must be taken completely out of the process, cooled and rebuilt. In sputter deposition reactors, the reactor must be taken completely offline, pressurized to ambient, opened up and mechanically cleaned. Although the actual mechanical cleaning does not take a large amount of time or labor, reassembling and evacuating the sputter reactor may take several hours.

Clearly, there is a need for a process to efficiently and effectively chemically dry clean the $TiO_2$ residues from the surfaces within a reactor. An effective chemical dry cleaning process can significantly increase the productivity and lower the cost-of-ownership (CoO) of the $TiO_2$ deposition process.

BRIEF SUMMARY OF THE INVENTION

The present invention is directed, in part, to processes for removing a $TiO_2$-containing substance from a reactor that is used to coat one or more articles with $TiO_2$. In one embodiment, there is provided a process for cleaning a reactor wherein the reactor is used to coat $TiO_2$ onto an article comprising: providing the reactor to be cleaned wherein the reactor contains a chamber comprising a surface at least partially coated with a substance comprising $TiO_2$; adding to the reactor a reactive gas comprising at least one cleaning agent; reacting the substance with the reactive gas to form at least one volatile product; and removing from the reactor the at least one volatile product to clean the reactor.

In another aspect of the present invention, there is provided a process for the deposition of a $TiO_2$ coating on a glass article comprising: placing the glass article into a reactor; depositing the $TiO_2$ coating onto the glass article and a substance comprising $TiO_2$ onto at least one surface within the reactor using at least one metal precursor wherein the depositing step is conducted by a process selected from chemical vapor deposition, vacuum deposition, spray pyrolysis and combinations thereof; adding to the reactor a reactive gas comprising at least one cleaning agent; reacting the substance with the reactive gas to form at least one volatile product; and removing from the reactor the at least one volatile product to clean the reactor.

BRIEF DESCRIPTION OF THE DRAWINGS

Not applicable.

DETAILED DESCRIPTION OF THE INVENTION

The process disclosed herein is useful for dry-cleaning deposition residues from at least a portion of a surface within a reactor that are used, for example, in the chemical vapor deposition (CVD), spray pyrolysis, and vacuum deposition (MSVD) of $TiO_2$ films onto at least one surface of an article such as glass. Unlike mechanical, wet-etching, and/or other cleaning processes, the process disclosed herein does not necessarily require the removal of the deposition system from the process line and/or the exposure of the chamber and its fixtures to liquid chemical solutions.

In one particular embodiment of the present invention, the process removes a non-volatile substance, such as $TiO_2$-containing deposits and residues, from at least a portion of a surface within the reactor and any fixtures contained therein. The material to be removed from the surface being cleaned is converted from a solid non-volatile material into species having a higher volatility that allows it to be readily removed by the reactor vacuum pump or other means. Thus, in certain embodiments, the substance may be removed from one or more surfaces within the reactor and any fixtures contained therein by contacting it with a reactive gas containing one or more chemical agents under conditions sufficient to react with the substance and form volatile products. The term "volatile products", as used herein, relates to reaction products and by-products of the reaction between the substance to be removed and a reactive gas comprising one or more chemical agents such as a fluorine-containing gas.

Since the fluorides and chlorides of titanium are relatively volatile compared to the oxides, the $TiO_2$-containing substance can be converted into fluorides, chlorides, or combinations thereof. This conversion is accomplished by contacting the substance to be removed with a reactive gas containing one or more chemical agents containing fluorine and/or chlorine. One or more chemical agents within the reactive gas react with the $TiO_2$-containing substance and form a Ti-containing volatile product.

Some expected volatile products of this reaction would be, but is not limited to, the compounds $TiCl_4$, $TiF_3$, and $TiF_4$. Of the foregoing, $TiCl_4$ is the most volatile due to its melting point of $-25°$ C. and a boiling point $136°$ C. compared to $TiF_3$ and $TiF_4$. $TiF_3$ has a melting point of $1200°$ C. and a boiling point of $1400°$ C. $TiF_4$ has a melting point of $284°$ C. and sublimes at a higher temperature without a definitive boiling point. For cleaning $TiO_2$-containing substances from a surface, it would be expected that certain chlorine-containing chemical agents such as $Cl_2$ or HCl would be the most effective in removing these substances since the expected reaction by-products are more volatile. However, it is surprising and unexpected that certain fluorine-containing chemical agents were far more effective in removing $TiO_2$ residues than these chlorine-containing chemical agents. Indeed, in certain embodiments, a reactive gas containing the chlorine-containing chemical agent alone was not effective in removing the $TiO_2$ residues.

Titanium dioxide coatings are deposited onto at least a portion of a surface of an article using one or more metal-containing precursors. The precursors react on the surface of the article to form a thin coating. The titanium dioxide coatings may be deposited using a variety of methods including, but not limited to, chemical vapor deposition (CVD) methods such as APCVD, thermal chemical vapor deposition, plasma enhanced chemical vapor deposition ("PECVD"), high density PECVD, photon assisted CVD, plasma-photon assisted ("PPECVD"), cryogenic chemical vapor deposition, chemical assisted vapor deposition, hot-filament chemical vapor deposition, CVD of a liquid polymer precursor, plasma ion beam deposition, direct ion beam CVD; spray pyrolysis, and vacuum deposition methods such as MSVD. An example of an APCVD glass coating process may be found, for example, Kalbskopf, Thin Solid Films, 77, 65, (1981), which is incorporated herein by reference in its entirety. Metal-containing precursors that may be used to form titanium dioxide coatings by a CVD method, include but are not limited to, titanium tetrachloride ($TiCl_4$), titanium tetraisopropoxide ($Ti(OC_3H_7)_4$) (hereinafter "TTIP") and titanium tetraethoxide ($Ti(OC_2H_5)_{-4}$) (hereinafter "TTEt"). Carrier gases that may be used in the CVD method include, but are not limited to, air, nitrogen, oxygen, ammonia and mixtures thereof. The concentration of the metal-containing precursor in the carrier gas is generally in the range of 0.1% to 0.4% by volume, but may be varied depending upon the metal-containing precursor(s) and/or CVD method used.

In embodiments wherein the $TiO_2$ coating is formed onto the article by the spray pyrolysis method, the one or more metal-containing precursors that may be used include relatively water insoluble organometallic reactants, specifically metal acetylacetonate compounds, which are jet milled or wet ground to a particle size of less than about 10 microns and suspended in an aqueous medium by the use of a chemical wetting agent. In these embodiments, a suitable metal acetylacetonate to form the $TiO_2$ coating is titanyl acetylacetonate ($TiO(C_5H_7O_2)_2$). The relative concentration of the metal acetylacetonate in the aqueous suspension preferably may range from about 5 to 40 weight percent of the aqueous suspension. The wetting agent may be any relatively low foaming surfactant, including anionic, nonionic or cationic compositions, although nonionic is preferred. The wetting agent is typically added at about 0.24% by weight, but can range from about 0.01% to 1% or more.

In embodiments where the $TiO_2$ coating is formed onto the article by a vacuum deposition method such as MSVD, one or more metal-containing precursors that are cathode targets are sputtered under negative pressure in an inert or oxygen-containing atmosphere to deposit a sputter coating onto the article. An example of a sputter process for coating formed flat glass articles is found, for example, in Pulker, Coatings on Glass, Elsevier, Amsterdam, 1984, p. 213, which is incorporated herein by reference in its entirety. The article may be heated during and/or after the deposition of the sputter coating to form the $TiO_2$ coating.

While the $TiO_2$ coating is deposited onto the surface of the article, a non-volatile substance comprising $TiO_2$ is also deposited upon one or more surfaces within the reactor and any fixtures contained therein. This non-volatile substance containing $TiO_2$ must be periodically cleaned from the reactor or else it may adversely effect production yields. To clean the reactor, a reactive gas is then added to the reactor, preferably after the flow of the one or more metal-containing precursors has been terminated. The reactive gas contains one or more chemical agents, preferably a fluorine-containing chemical agent, that reacts with the substance and provides a volatile product. Examples of fluorine-containing chemical agents include: $NF_3$ (nitrogen trifluoride), $ClF_3$ (chlorine trifluoride), ClF (chlorine monofluoride), $SF_6$ (sulfur hexafluoride), perfluorocarbons such as $CF_4$ and $C_2F_6$ etc, hydrofluorocarbons such as $CHF_3$ and $C_3F_7H$ etc., oxyfluorocarbons such as $C_4F_8O$ (perfluorotetrahydrofuran) etc., hypofluorites such as $CF_3$—OF (fluoroxytrifluoromethane ("FTM")) and FO—$CF_2$—OF (bis-difluoroxydifluoromethane ("BDM") etc., fluoroperoxides such as $CF_3$—O—O—$CF_3$, F—O—O—F etc., fluorotrioxides such as $CF_3$—O—O—O—$CF_3$ etc., $COF_2$ (carbonyl flouride), NOF, $NF_xCl_{3-x}$, where x=1-2, and molecular $F_2$ etc.

In certain embodiments, one or more chlorine-containing chemical agents may be used in addition to, or in place of, the fluorine-containing chemical agent. Examples of chlorine-containing chemical agents include $BCl_3$, $COCl_2$, HCl, $Cl_2$, $ClF_3$, ClF, and $NF_zCl_{3-z}$, where z is an integer from 0 to 2, chlorocarbons, and chlorohydrocarbons (such as $C_xH_yCl_z$ where x is a number ranging from 1 to 6, y is a number ranging from 0 to 13, and z is a number ranging from 1 to 14).

The reactive gas comprising one or more chemical agents contained therein can be delivered by a variety of means, such as, but not limited to, conventional cylinders, safe delivery systems, vacuum delivery systems, or solid or liquid-based generators that create the reactive gas at the point of use. The concentration of the chemical agent within the reactive gas can range from 0.1 to 100% by volume. In certain embodiments, the reactive gas may be delivered using the same fluid inlet lines as those used in delivering one or more metal-containing precursor gases. In these embodiments, the inlet lines may be purged with one or more inert gases prior to flowing the reactive gas to the reactor. The cleaning step or the flow of reactive gas may be terminated when substantially no volatile products are detected in the reactor effluent.

In addition to the chemical agents described herein, inert diluent gases such as nitrogen, helium, neon, argon, krypton, xenon, etc. can also be added to the reactive gas. In certain embodiments, inert diluent gases can modify the plasma characteristics and cleaning processes to better suit some specific applications. The concentration of the inert gases within the reactive gas can range from 0 to 99.9% by volume.

The process of the invention is useful for cleaning the inside of reactors and the surfaces of various fixtures contained therein such as, but not limited to, fluid inlets and outlets, showerheads, work piece platforms, etc. In these embodiments, the surface of the chamber and fixtures contained therein may be comprised of a variety of different materials including metals, such as titanium, aluminum, stainless steel, nickel, or alloys comprising same, or insulating materials, such as a ceramic, e.g., quartz or $Al_2O_3$.

The reaction between the reactive gases having one or more chemical agents contained therein and the $TiO_2$-containing substance may be activated by one or more energy sources such as, but not limited to, in situ plasma, remote plasma, remote thermal/catalytic activation, in-situ thermal heating, electron attachment, ion beam, and photo activation. These processes may be used alone or in combination. The energy source can be, for example, thermal heating or plasma activation. In certain embodiments, higher temperatures can accelerate chemical reactions and make certain volatile products such as reaction byproducts more volatile. However, there may be practical limitations on temperature in certain reactors. Plasmas can generate more reactive species to facilitate reactions. Ions in the plasmas are accelerated by the electric field in the plasma sheath to gain energy. Energetic ions impinging upon surfaces can provide the energy needed to overcome the reaction activation energy barrier. Ion bombardment also may help to generate and remove volatile products. Optionally, one can combine both thermal and plasma activation mechanisms to enhance the desired reactions for the dry etching/cleaning process. As an alternative to in situ plasma cleaning, a remote plasma source can also generate reactive species for cleaning material residues from the deposition chambers. In certain embodiments, reactions between remote plasma generated reactive species and $TiO_2$-containing substances can be activated and/or enhanced by heating the reactor to a temperature sufficient to dissociate the one or more chemical agent contained within the reactive gas. The specific temperature required to activate the cleaning reaction with the substance to be removed depends on the cleaning agent(s) adopted. For example, in embodiments wherein $NF_3$ is used as the cleaning agent, the chamber walls may need to be heated to temperatures of at least 300° C. or at least 500° C. Alternatively, in embodiments where other cleaning agents, such as $F_2$ and/or $ClF_3$, are used, the required temperature may be lower. In still other embodiments, depending upon the cleaning agent(s) selected, spontaneous cleaning reaction may occur even at room temperature.

In certain embodiments, thermal or plasma activation and/or enhancement can impact the efficacy of cleaning of the $TiO_2$-containing substances. In thermal heating activation, the deposition reactor components are heated either by resistive heaters and/or by intense lamps. Cleaning gases can be thermally decomposed into reactive radicals and atoms that subsequently volatize the deposition residues. Elevated temperature may also provide the energy source to overcome reaction activation energy barrier and enhance the reaction rates. As before, the reaction between thermal and/or plasma generated reactive species and $TiO_2$-containing substances can be activated and/or enhanced by heating the reactor to a temperature sufficient to dissociate the one or more chemical agents contained within the reactive gas. The specific temperature required to activate the cleaning reaction with the substance to be removed depends on the cleaning agent(s) adopted. In these embodiments, the pressure range may generally be from 10 mTorr to 760 Torr or from 1 Torr to 760 Torr.

In embodiments wherein an in situ plasma source is used to activate the cleaning chemistry, molecules of the one or more chemical agent may be broken down by the discharge to form reactive ions and radicals. For example, the fluorine-containing chemical agent $NF_3$ can be broken down into fluorine-containing ions and radicals that can react with the $TiO_2$-containing substance to form a volatile product that can be removed from the reactor by vacuum pumps. The reaction between the reactive species and $TiO_2$-containing substances can be activated and/or enhanced by heating the reactor to a temperature sufficient to dissociate the one or more chemical agent contained within the reactive gas. The specific temperature required to activate the cleaning reaction with the substance to be removed depends on the cleaning agent(s) adopted. For in situ plasma activation, one can generate the plasma using a 13.56 MHz RF power supply with a RF power density of at least 0.2 $W/cm^2$, or at least 0.5 $W/cm^2$, or at least 1 $W/cm^2$. One can also operate the in situ plasma at RF frequencies lower than 13.56 MHz to enhance ion assisted cleaning of grounded reactor walls. The operating pressure may range from 2.5 mTorr to 100 Torr, or from 5 mTorr to 50 Torr, or from 10 mTorr to 20 Torr. Optionally, one can also combine thermal and plasma enhancement.

In certain embodiments, a remote plasma source, such as, but not limited to, a remote thermal activation source, a remote catalytically activated source, or a source which combines thermal and catalytic activation, may be used rather than an in situ plasma to generate the volatile product. In remote plasma cleaning, an intense discharge of cleaning gases is generated outside of the deposition chamber, reactive atoms and radicals then flow downstream into the deposition chamber to volatize the deposition residues. The remote plasma source can be generated by either an RF or a microwave source. In addition, reactions between remote plasma generated reactive species and the deposition residues can be activated/enhanced by heating the reactor. The reaction between the remote plasma generated reactive species and $TiO_2$-containing substances can be activated and/or enhanced by heating the reactor to a temperature sufficient to dissociate the one or more chemical agent contained within the reactive gas. The specific temperature required to activate the cleaning reaction with the substance to be removed depends on the cleaning agent(s) adopted.

In remote thermal activation, the reactive gas first flows through a heated area outside of the vessel to be cleaned. Here, the gas dissociates by contact with the high temperatures within a vessel outside of the reactor to be cleaned. Alternative approaches include the use of a catalytic converter to dissociate the reactive gas, or a combination of thermal heating and catalytic cracking to facilitate activation of the one or more cleaning agents within the reactive gas.

In alternative embodiments, the molecules of one or more chemical agents within the reactive gas can be dissociated by intense exposure to photons to form reactive radicals and atoms. For example ultraviolet, deep ultraviolet and vacuum ultraviolet radiation can assist breaking strong chemical bonds in deposition residues as well as dissociating the one or more chemical agents within the reactive gas thereby increasing the removal rates of $TiO_2$-containing deposition residues. Other means of activation and enhancement to the cleaning processes can also be employed. For example, one can use photon induced chemical reactions to generate reactive species and enhance the etching/cleaning reactions.

In certain embodiments, the reactor can remain at substantially similar operating conditions (pressure and temperature) during the cleaning operation as during the deposition operation. For example, in embodiments wherein the reactor is a CVD reactor, the flow of deposition gas is stopped and purged from the reactor and delivery lines. If needed, the temperature of the reactor temperature may be changed to an optimum value; however in the preferred mode the reactor temperature is maintained at the deposition process conditions. A flow of reactive gas containing one or more of the cleaning agents, along with an optional inert diluent, is flowed into the reactor. The reactive gas converts the substance, i.e., debris on the reactor surfaces made from the deposition gas, i.e., metal-containing precursor, into volatile compounds that are swept from the reactor. After a prescribed time, or after the concentration of the formed volatile compounds detected in the reactor effluent is below an acceptable level, the cleaning gas flow is stopped and preferably purged from the reactor and delivery lines. The flow of the deposition gas is then restarted and the CVD deposition process resumed. In other embodiments such as sputter reactors which operate at millitorr pressures, it may take several hours to return to base pressure after being opened for a manual cleaning operation. However, since the cleaning step present invention may be conducted at similar operating conditions as that of the depositing step, sputter reactors can be placed back into coating service in a few minutes after cleaning.

In a further embodiment, the method described herein may be used to rework articles that were previously coated in an unacceptable manner, such as articles having a defective coating. In these embodiments, the articles would be stripped of the $TiO_2$ coating in order to be re-coated in a subsequent step. This rework step can be conducted in the reactor while the cleaning step is also being conducted or placed in a separate reactor for cleaning.

While the present invention is described in particular with reference to glass coating reactors, it is understood that the invention is not necessarily limited thereto. Certain aspects may be used, for example, in applications requiring the removal of a $TiO_2$-containing substance from a surface.

The invention will be illustrated in more detail with reference to the following Examples, but it should be understood that the present invention is not deemed to be limited thereto.

EXAMPLES

The following are experimental examples for removing a $TiO_2$-containing substance from an article using a thermal plasma reactor and a remote plasma reactor. The thermal plasma reactor, which is a parallel plate capacitively coupled RF plasma reactor, has the capability for in-situ plasma cleaning and thermal cleaning. In all of the following experiments, test samples were prepared from $TiO_2$-containing debris or powders that was collected from a deposition chamber used to provide a $TiO_2$ coating onto an article. The $TiO_2$ removal rate was determined by the weight change of the test sample before and after a timed exposure under processing conditions.

Example 1

In Situ Plasma Cleaning of $TiO_2$

Four tests illustrating the in situ plasma cleaning of $TiO_2$-containing substance using a variety of different reactive gases were conducted in a laboratory reactor. The laboratory reactor contained a base pedestal or bottom electrode, a top electrode connected to RF power, a gas inlet for the flow of process gases, and an outlet that is connected to a turbo pump. A test sample was loaded into the reactor and placed onto the bottom electrode. The walls of the reactor were grounded and maintained at room temperature. When the reactor was stabilized at a chamber pressure of 150 mTorr, a reactive gas was introduced into the reactor at a certain gas flow rate. The bottom electrode was then powered by a 13.56 MHz RF power source. Table I provides the composition of the reactive gas and the gas flow rate of the reagents contained therein. As Table I illustrates, the chamber pressure and power for each test was 150 mTorr and 200 W, respectively. The reactive gas was fed into the chamber through gas inlet and volatile products of the reaction and the reactive gas are removed from the reactor using the turbo pump. Under the same chamber pressure and plasma power, $NF_3$ provided a higher $TiO_2$ removal rate than that of a mixture of $NF_3$ and $Cl_2$ and chlorine-containing agents $Cl_2$ or $BCl_3$ alone. Further, at 50 sccm $BCl_3$ almost no $TiO_2$ was removed.

TABLE I

TiO₂ Remove Rates at Different Experimental Conditions

| Test # | Plasma Power (W) | Chamber Pressure (mTorr) | Reactive Gas Composition | TiO₂ Removal Rate (mg/min-cm²) |
|---|---|---|---|---|
| 1 | 200 | 150 | 50 sccm BCl₃ | 0 |
| 2 | 200 | 150 | 15 sccm Cl₂ and 85 sccm He | 0.11 |
| 3 | 200 | 150 | 15 sccm NF₃ and 85 sccm He | 0.34 |
| 4 | 200 | 150 | 15 sccm NF₃, 15 sccm Cl₂, and 85 sccm He | 0.22 |

Example 2

Remote NF₃ Plasma Cleaning of TiO₂

Remote plasma cleaning experiments were conducted using an Applied Materials P-5000 DxZ PECVD chamber that was retrofitted with an Astron-ex remote from MKS Corporation. A test sample coated with $TiO_2$ was placed on the wafer pedestal. The resistive heater in the wafer pedestal was turned off during the cleaning experiments to simulate unheated chamber walls. After evacuating the reactor, a reactive gas containing 33% by volume $NF_3$ and 67% by volume argon are introduced into the Astron-ex remote plasma generator with 6 kW of RF power turned on. It is believed that an intense plasma breaks down $NF_3$ molecules into reactive species, which flow downstream through the showerhead into the chamber and react with the $TiO_2$ sample on the wafer. The volatile compounds formed by the reactions between the reactive species and $TiO_2$ are removed from the reactor through the vacuum port. At a process flow of 1400 sccm Ar and 700 sccm $NF_3$, the $TiO_2$ removal rate was about 4 mg/min-cm². Assuming that the $TiO_2$ thin film on the sample has the same density as the debris, the removal rate would be equivalent to 20 μm/min. Compared with Example 1, the remote plasma reactor removed $TiO_2$ at a rate approximately twelve times higher. The higher removal rate may result from the higher power and process gas flow rate used in the remote plasma reactor.

Example 3

Thermal BCl₃ Cleaning of TiO₂

This experiment was conducted using the experimental set-up as Example 1 except that a pedestal heater replaced the bottom electrode. The test sample was placed on a 4-inch carrier wafer, which was placed onto the pedestal heater. After the introduction of the sample and evacuation of the reactor, the pedestal and the test sample was heated to a preset temperature. A reactive gas containing $BCl_3$ was then fed into the reactor to reach a preset chamber pressure to remove the $TiO_2$-containing substance. The volatile compounds formed by the reactions between the $TiO_2$ and the reactive gas were removed from the reactor chamber by the vacuum system. At a sample temperature of 350° C. sample, 100 torr chamber pressure, and 100 sccm $BCl_3$ flow, the $TiO_2$ removal rate was 0.08 mg/min-cm², which was lower than the previous examples.

Example 4

Thermogravimetric Analysis

To understand the reaction between $TiO_2$ and $NF_3$, a thermogravimetric analyzer, Model TA 2050 manufactured by TA Instrument of New Castle, Del., was used to monitor the reaction progress along with temperature. After loading sample and evacuating down to the base vacuum pressure, $NF_3$ gas from a compressed gas cylinder was fed into the analyzer. The system was then heated from ambient temperature to 500° C. at 5° C./min. The weight of the sample was monitored with respect to time and temperature. It was found that $TiO_2$ started to react with the $NF_3$ gas at 315° C. and was completely reacted by 430° C.

The invention claimed is:

1. A process for removing $TiO_2$ from a reactor wherein the reactor is used to coat $TiO_2$ onto an article, said process comprising:
providing the reactor to be cleaned wherein the reactor contains a chamber comprising a surface other than the article at least partially coated with a substance comprising $TiO_2$;
adding to the reactor a reactive gas comprising at least one cleaning gas;
reacting the $TiO_2$ with the reactive gas to form at least one volatile product; and
removing from the reactor the at least one volatile product.

2. The process of claim 1, wherein the at least one cleaning gas is selected from the group consisting of a fluorine-containing cleaning gas, a chlorine-containing cleaning gas, and combinations thereof.

3. The process of claim 2, wherein the at least one cleaning gas is a chlorine-containing cleaning gas.

4. The process of claim 3 wherein the chlorine-containing cleaning gas is at least one member selected from the group consisting of $BCl_3$, $COCl_2$, HCl, $Cl_2$, $ClF_3$, and $NF_zCl_{3-z}$, where z is an integer from 0 to 2.

5. The process of claim 2 wherein the at least one cleaning gas is a fluorine-containing cleaning gas.

6. The process of claim 5 wherein the fluorine-containing cleaning gas comprises at least one member selected from the group consisting of $NF_3$; $ClF_3$; ClF; $SF_6$; a perfluorocarbon; a hydrofluorocarbon; an oxyfluorocarbon; a hypofluorite, a fluoroperoxide; a fluorotrioxide; $COF_2$; NOF; $F_2$; $NF_nCl_{3-n}$, where n is a number ranging from 1 to 2; and combinations thereof.

7. The process of claim 6, wherein the fluorine-containing cleaning gas is $NF_3$.

8. The process of claim 1, wherein the reactive gas further comprises an inert diluent gas.

9. The process of claim 1, wherein the reacting step is conducted by an in situ plasma, a remote plasma, an in-situ thermal source, a remote thermal source, a remote catalytic source, a photon activation source, or combinations thereof.

10. The process of claim 9, wherein the reacting step is conducted by an in situ plasma.

11. The process of claim 9 wherein the reacting step is conducted by a remote plasma.

12. The process of claim 1, wherein the reactive gas is conveyed to the chamber from a gas cylinder, a safe delivery system, a pipeline, a point of use delivery system, a vacuum delivery system, or combinations thereof.

13. The process of claim 5, wherein the fluorine-containing reactive gas is formed in close proximity to the reactor by a point-of-use generator.

14. The process of claim 1 wherein the article is selected from the group consisting of a glass-containing work piece, a metal-containing work piece, a ceramic work piece, and mixtures thereof.

15. A process for the deposition of a $TiO_2$ coating on a glass article, the process comprising:
placing the glass article into a reactor;
depositing the $TiO_2$ coating onto the glass article and a substance comprising $TiO_2$ onto at least one surface within the reactor other than the article using at least one metal precursor wherein the depositing step is conducted by a process selected from the group consisting of chemical vapor deposition, vacuum deposition, spray pyrolysis and combinations thereof;
adding to the reactor a reactive gas comprising at least one cleaning gas;
reacting the $TiO_2$ on the reactor surface other than the article with the reactive gas to form at least one volatile product; and
removing from the reactor the at least one volatile product.

16. The process of claim 15, wherein the at least one cleaning gas is selected from the group consisting of a fluorine-containing cleaning gas, a chlorine-containing cleaning gas, and combinations thereof.

17. The process of claim 16, wherein the at least one cleaning gas is a chlorine-containing cleaning gas.

18. The process of claim 17 wherein the chlorine-containing cleaning gas is at least one member selected from the group consisting of $BCl_3$, $COCl_2$, HCl, $Cl_2$, $ClF_3$, and $NF_zCl_{3-z}$, where z is an integer from 0 to 2.

19. The process of claim 16 wherein the at least one cleaning gas is a fluorine-containing cleaning gas.

20. The process of claim 19 wherein the fluorine-containing cleaning gas comprises at least one member selected from the group consisting of $NF_3$; $ClF_3$; ClF; $SF_6$; a perfluorocarbon; a hydrofluorocarbon; an oxyfluorocarbon; a hypofluorite, a fluoroperoxide; a fluorotrioxide; $COF_2$; NOF; $F_2$; $NF_nCl_{3-n}$, where n is a number ranging from 1 to 2; and combinations thereof.

* * * * *